United States Patent
Yang

(10) Patent No.: US 9,170,879 B2
(45) Date of Patent: *Oct. 27, 2015

(54) METHOD AND APPARATUS FOR SCRUBBING ACCUMULATED DATA ERRORS FROM A MEMORY SYSTEM

(75) Inventor: Hsu Kai Yang, Pleasanton, CA (US)

(73) Assignee: Headway Technologies, Inc., Milpitas, CA (US)

( * ) Notice: Subject to any disclaimer, the term of this patent is extended or adjusted under 35 U.S.C. 154(b) by 1010 days.

This patent is subject to a terminal disclaimer.

(21) Appl. No.: 12/456,923

(22) Filed: Jun. 24, 2009

(65) Prior Publication Data

US 2010/0332900 A1  Dec. 30, 2010

(51) Int. Cl.
G06F 11/10 (2006.01)
G11C 16/34 (2006.01)
G11C 29/46 (2006.01)

(52) U.S. Cl.
CPC .......... *G06F 11/106* (2013.01); *G06F 11/1096* (2013.01); *G11C 16/349* (2013.01); *G11C 16/3418* (2013.01); *G11C 29/46* (2013.01)

(58) Field of Classification Search
CPC .... G06F 11/1096; G11C 29/00; G11C 29/04; G11C 29/12; G11C 29/46; G11C 16/3418; G11C 16/3422; G11C 16/3431; G11C 16/349
USPC ........................................................ 714/718
See application file for complete search history.

(56) References Cited

U.S. PATENT DOCUMENTS

| | | | |
|---|---|---|---|
| 5,987,628 A * | 11/1999 | Von Bokern et al. ........... 714/48 |
| 6,704,230 B1 | 3/2004 | DeBrosse et al. |
| 6,838,331 B2 * | 1/2005 | Klein ............................ 438/238 |
| 7,012,835 B2 * | 3/2006 | Gonzalez et al. ........ 365/185.11 |
| 7,089,461 B2 * | 8/2006 | Gilbert et al. ................. 714/47.2 |
| 7,100,004 B2 * | 8/2006 | Chen et al. .................... 711/159 |
| 7,137,038 B2 * | 11/2006 | New et al. ....................... 714/42 |
| 7,274,057 B2 | 9/2007 | Worledge |

(Continued)

FOREIGN PATENT DOCUMENTS

WO  WO 2009/025857  2/2009

OTHER PUBLICATIONS

"A Novel Nonvolatile Memory with Spin Torque Transfer Magnetization Switching: Spin-RAM," by M. Hosomi et al., IEEE International.

(Continued)

*Primary Examiner* — Joseph Schell

(74) *Attorney, Agent, or Firm* — Saile Ackerman LLC; Stephen B. Ackerman; Billy Knowles

(57) ABSTRACT

A data scrubbing apparatus corrects disturb data errors occurring in an array of memory cells such as SMT MRAM cells. The data scrubbing apparatus receives an error indication that an error has occurred during a read operation of a grouping of memory cells within the array of memory cells. The data scrubbing apparatus may generate an address describing the location of the memory cells to be scrubbed. The data scrubbing apparatus then commands the array of memory cells to write back the corrected data. Based on a scrub threshold value, the data scrubbing apparatus writes the corrected data back after a specific number of errors. The data scrubbing apparatus may further suspend writing back during a writing of data. The data scrubbing apparatus provides a busy indicator externally during a write back of corrected data.

49 Claims, 6 Drawing Sheets

(56) References Cited

U.S. PATENT DOCUMENTS

| | | |
|---|---|---|
| 7,307,876 B2 | 12/2007 | Kent et al. |
| 7,430,693 B2 | 9/2008 | Noguchi et al. |
| 7,477,547 B2 * | 1/2009 | Lin .................... 365/185.09 |
| 7,661,045 B2 * | 2/2010 | Browne et al. ............... 714/723 |
| 7,864,579 B2 * | 1/2011 | Gutsche et al. .......... 365/185.09 |
| 8,014,192 B2 | 9/2011 | Phillips et al. |
| 8,255,772 B1 * | 8/2012 | Foley ........................ 714/764 |
| 2005/0073884 A1 * | 4/2005 | Gonzalez et al. ........ 365/185.02 |
| 2005/0273646 A1 * | 12/2005 | Hillier et al. .................... 714/5 |
| 2007/0011513 A1 * | 1/2007 | Biswas et al. ............... 714/722 |
| 2008/0010566 A1 | 1/2008 | Chang et al. |
| 2008/0072116 A1 * | 3/2008 | Brittain et al. ............... 714/758 |
| 2008/0162991 A1 | 7/2008 | Dell et al. |
| 2009/0070648 A1 * | 3/2009 | Allison et al. ............... 714/746 |
| 2009/0103358 A1 | 4/2009 | Sommer et al. |
| 2009/0248964 A1 * | 10/2009 | Yano et al. .................... 711/103 |
| 2009/0327581 A1 * | 12/2009 | Coulson .................... 711/103 |
| 2010/0122148 A1 * | 5/2010 | Flynn et al. .................... 714/773 |
| 2010/0257415 A1 * | 10/2010 | Lin et al. ....................... 714/718 |

OTHER PUBLICATIONS

Electron Devices Meeting, 2005, IEDM Technical Digest, Dec. 2005, pp. 459-462.

Foreign Search Report PCT/US 10/01728, Jul. 29, 2010, Magic Technologies, Inc.

Magnetic Memory Fundamentals and Technology, by Denny D. Tang and Yuan-Jen Lee., MagIC Technologies, Inc., Published in the US, Cambridge University Press 2010, ISBN 978-0-521-44964-9, pp. 153-155.

"Reliability of 4MBit MRAM," by Johan Akerman et al., IEEE 05CH37616, 43rd Annual International Reliability Physics Symposium, San Jose, CA, Apr. 17, 2005, pp. 163-167.

* cited by examiner

FIG. 1 – Prior Art

METHOD AND APPARATUS FOR SCRUBBING ACCUMULATED DATA ERRORS FROM A MEMORY SYSTEM

BACKGROUND OF THE INVENTION

1. Field of the Invention

This invention relates generally to memory cells and array structures for memory cells. More particularly, this invention relates to magnetic random access memory (MRAM) cells and array structures for MRAM cells. Even more particularly, this invention relates to methods and apparatus for eliminating data errors in spin moment transfer (SMT) MRAM cells and array structures of spin moment transfer (SMT) MRAM cells.

2. Description of Related Art

The term Spin-RAM refers to a magnetic tunnel junction (MTJ) random access memory (RAM). In this context, the term "spin" refers to the angular momentum of electrons passing through an MTJ that will alter the magnetic moment of a free layer of an MTJ device. Electrons possess both electric charge and angular momentum (or spin). It is known in the art that a current of spin-polarized electrons can change the magnetic orientation of a free ferromagnetic layer of an MTJ via an exchange of spin angular momentum.

"A Novel Nonvolatile Memory with Spin-torque Transfer Magnetization Switching: Spin-Ram", Hosomi, et al., IEEE International Electron Devices Meeting, 2005. IEDM Technical Digest. December 2005, pp.: 459-462, provides a nonvolatile memory utilizing spin-torque transfer magnetization switching (STS), abbreviated Spin-RAM. The Spin-RAM is programmed by magnetization reversal through an interaction of a spin momentum-torque-transferred current and a magnetic moment of memory layers in magnetic tunnel junctions (MTJs), and therefore an external magnetic field is unnecessary as that for a conventional MRAM.

A spin-torque MTJ element has two ferromagnetic layersand a spacer layer between the ferromagnetic layers. One ferromagnetic layer is a pinned magnetic layer and the other ferromagnetic layer is a free magnetic layer. The spacer layer is a tunnel barrier layer. When a spin polarized electron flows through the ferromagnetic layers, the spin direction rotates according to the directions of magnetic moment. The rotation of spin direction of the electrons in the ferromagnetic layers are the origin of a spin-torque to the magnetic moment. If the given torque is large enough, magnetization of ferromagnetic layer and thus the magnetic moment is reversed. The magnetization of the ferromagnetic layers transforms from parallel to anti-parallel alignment. This changes the MTJ element from a low resistance state to a high resistance state thus changing the logic state of the MTJ element from a first logic state (0) to a second logic state (1). A voltage source provides the programming voltage that generates the programming current that is reversed appropriately change the programming state of the MTJ element. Reading an SMT MRAM cell involves applying a voltage across the SMT MRAM cell and detecting the resistance (or current) difference. This process is similar to programming the cell only at lower current level and may lead to disturb errors. Disturb errors being permanent errors created by the low current during reading of the SMT MRAM cell.

U.S. Pat. No. 6,704,230 (DeBrosse, et al.) provides a method and apparatus for reducing data errors in a magnetoresistive random access memory (MRAM). Data bits and associated error correction code (ECC) check bits are stored into a storage area. Thereafter, the data bits and ECC check bits are read out and any errors are detected and corrected. A data refresh is then initiated based on a count and data bits and associated ECC check bits stored in the storage area are then refreshed by accessing the stored data bits and the associated ECC check bits. The data bits and their associated ECC check bits are checked, corrected and restored to the storage area.

SUMMARY OF THE INVENTION

An object of this invention is to provide a method and apparatus for eliminating disturb errors occurring in an SMT MRAM array caused during reading an SMT MRAM array.

To accomplish at least this object, a data scrubbing apparatus corrects disturb data errors occurring in an array of memory cells such as SMT MRAM cells. The data scrubbing apparatus receives an error indication that an error has occurred during an operation such as a read operation of a grouping of memory cells within the array of memory cells. The data scrubbing apparatus generates an address describing the location of the grouping of the memory cells within the memory array and the error correction code bits covering the grouping of memory cells that is transferred to the array of memory cells. The data scrubbing apparatus then commands the array of memory cells to write back corrected data to the selected group of memory cells.

The data scrubbing apparatus may further receive provided data to be written to the array of the memory cells as well as the corrected data and transfers the provided data or the corrected data to the array of memory cells.

Based on a scrub threshold value, the data scrubbing apparatus writes the corrected data back to the grouping of memory cells upon each receipt of the error indication. Alternately the scrub threshold value may indicate that the data scrubbing apparatus writes the corrected data back after a specific number of errors in the selected group of memory cells. For instance, the specific number of errors specified by the scrub threshold value maybe equal to the equal to a number of errors corrected in error correcting within the array of memory cells. In another alternative, the scrub threshold value may indicate that the data scrubbing apparatus writes the corrected data back after each read cycle of the array of memory cells.

The data scrubbing apparatus may further suspend writing back during a writing of data to the array of memory cells. Additionally the data scrubbing apparatus provides a busy indicator externally to the array of memory cells during a write back of corrected data.

DETAILED DESCRIPTION OF THE INVENTION

Figure 1:
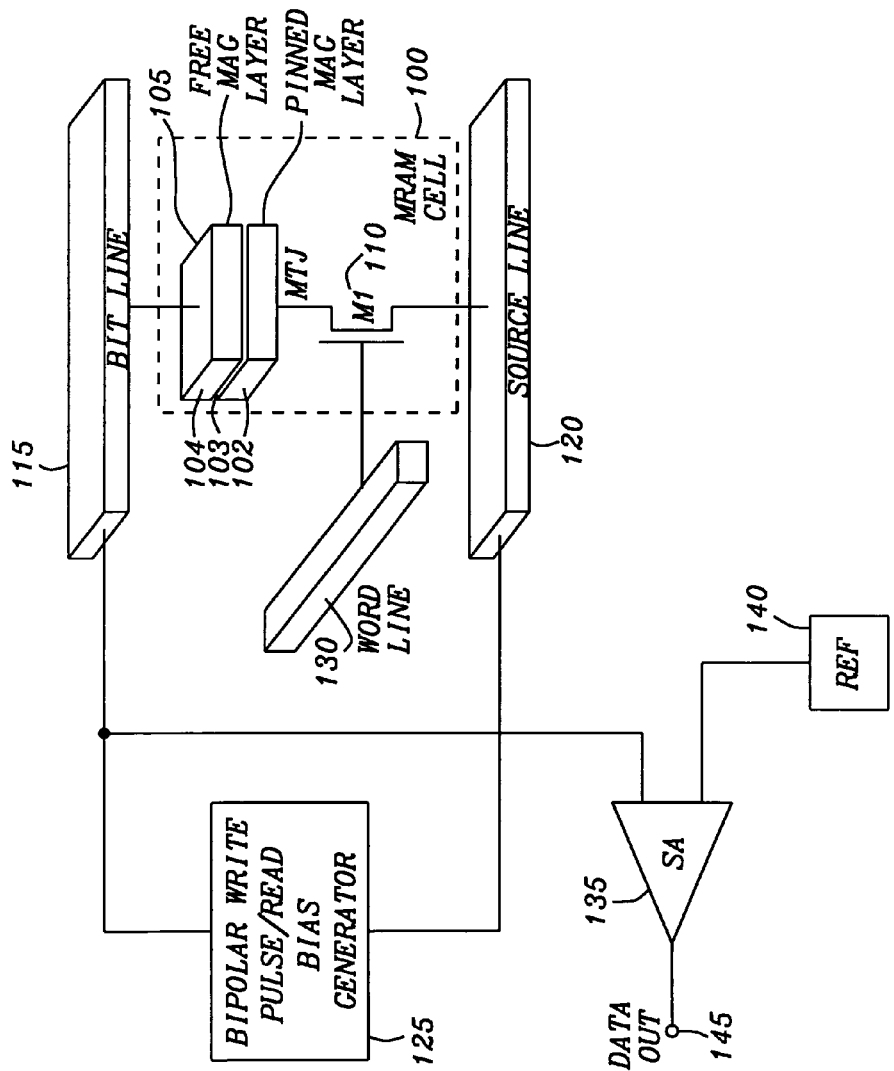
FIG. 1 is a functional diagram of a spin-torque magnetic tunnel junction memory cell and its peripheral circuitry.

As illustrated in FIG. 1, a spin moment transfer (SMT) MRAM cell 100 consists of an MTJ element 105 and a Metal Oxide Semiconductor (MOS) transistor 110. The MTJ element 105 is composed of a pinned ferromagnetic layer 102 and a free ferromagnetic layer 104, and a tunnel barrier layer 103. The drain of the MOS transistor 110 is connected through a nonmagnetic layer to the pinned ferromagnetic layer 102. The free ferromagnetic layer 104 is connected to a bit line 115 and the source of the MOS transistor 110 is connected the source line 120. The bit line 115 and source select line 120 are connected to the bipolar write pulse/read bias generator 125. The bipolar write pulse/read bias generator 125 provides the necessary programming current to the MTJ element 105 through the bit line 115 and the source select line 120. The direction being determined by logic state being programmed to the MTJ element 105.

The gate of the MOS transistor 110 is connected to a word line 130. The word line 130 transfers a word line select voltage to the gate of the MOS transistor 110 to activate the MOS transistor 110 for reading or writing the logic state of the MTJ element 105. A sense amplifier 135 has one input terminal connected to the bit line and a second input terminal connected to a voltage reference circuit. When the word line 115 has the word line select voltage activated to turn on the MOS transistor 110, the bipolar write pulse/read bias generator 125 generates a bias current that passes through MTJ element 105. A voltage is developed across the MTJ element 105 that is sensed by the sense amplifier 135 and compared with the reference voltage generator to determine the logic state written to the MTJ element 105. This logic state is transferred to the output terminal of the sense amplifier 135 as to the data output signal 145.

Reading the SMT MRAM cell 100 involves applying a voltage across the SMT MRAM cell 100 and detecting the resistance (or current) difference of the SMT MRAM cell 100. This process is similar to programming the cell 100 only at lower current level. So there is a statistical chance of the cell 100 being disturbed or rewritten. When the separation between the current level to program the cell 100 and current level needed to read the cell 100 is small, the occurrence of an SMT MRAM cell 100 being disturbed or rewritten can increase significantly. Further, the errors will accumulate with continuous reading.

To prevent failure of the SMT MRAM cell 100 from read disturb errors, a data scrubbing apparatus receives an error indication during an operation such as a read operation of a grouping of memory cells within the array of memory cells and generates an address describing the location of the grouping of the memory cells within the memory array and the error correction code bits covering the grouping of memory cells that is transferred to the array of memory cells. The data scrubbing apparatus then commands the array of memory cells to write back the corrected data to the selected group of memory cells.

Figure 2:
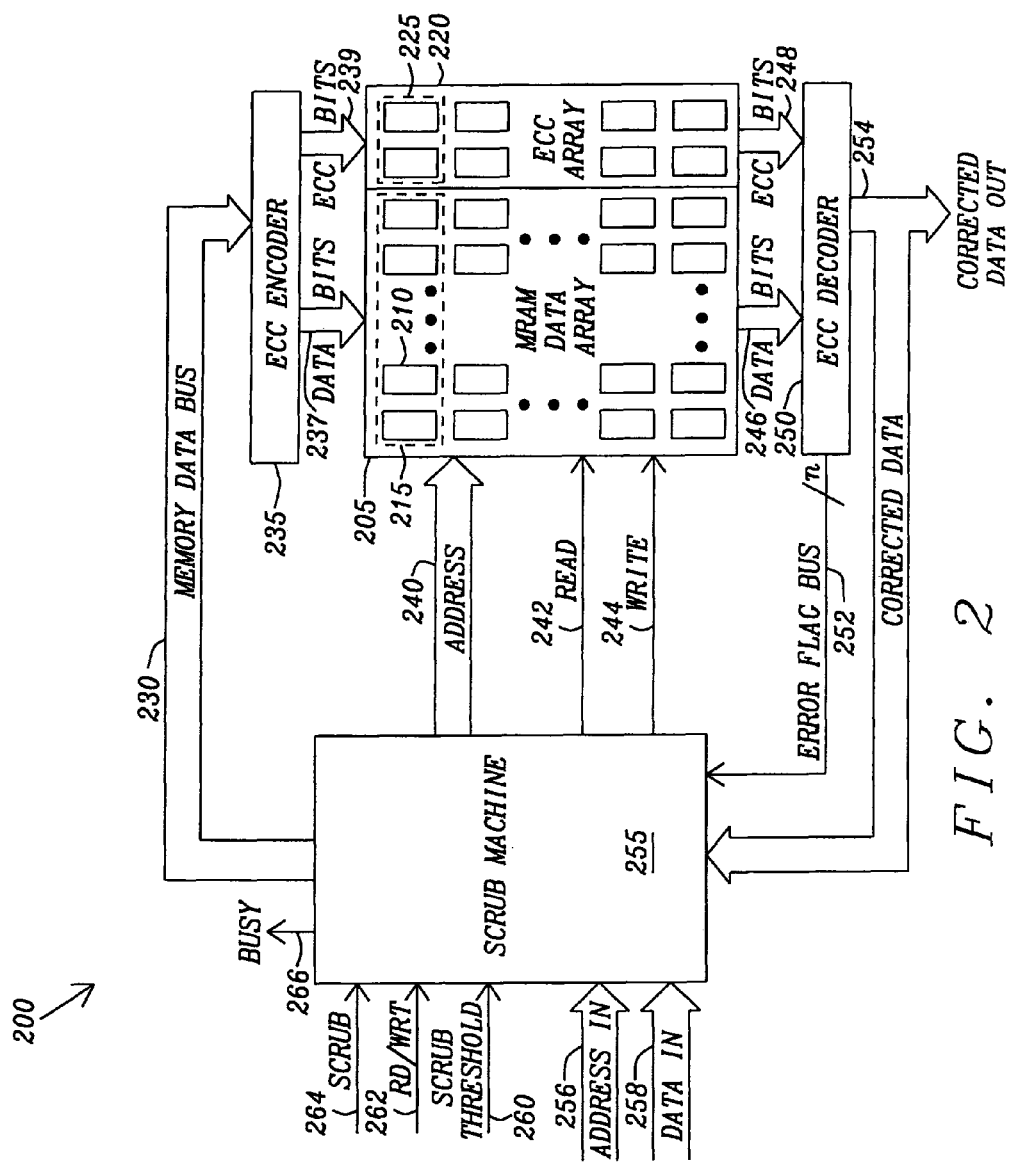
FIG. 2 is a block diagram of a SMT MRAM device including an embodiment of a scrubbing machine.

Refer now to FIG. 2 for a description of an SMT MRAM memory device 200 incorporating a data scrubbing apparatus or scrub machine 255. The scrub machine 255 is connected to an array 205 of SMT MRAM memory cells 210. The SMT MRAM memory cells 210 are arranged in rows and columns. A grouping of the SMT MRAM memory cells 210 such as the rows 215 of the SMT MRAM memory cells 210 are each covered or protected from errors by an error correction code (ECC). Error correction data is read to and retained in an ECC array 220 of SMT MRAM memory cells 210. The ECC array 220 has rows of the SMT MRAM memory cells 210 containing the error correction data for an associated grouping of the SMT MRAM memory cells 210. In this embodiment the row 215 of the array 205 of the SMT MRAM memory cells 210 is covered or protected by the grouping or row 225 of the SMT MRAM memory cells 210 into which the Error correction data is stored.

The scrub machine 255 receives an externally provided address 256 and externally provided data 258. A read/write control signal 262 determines whether the array 205 of SMT MRAM memory cells 210 is to be written to or read from. During a write operation, the externally provided data 258 is transferred by the memory data bus 230 to the ECC encoder 235. The ECC encoder 235 generates the necessary error correction data bits 239 that are appended to the memory data bits 237 for storage at the location pointed to by the array address input 240 respectively in the memory array 205 and the ECC array 220. The read command 242 and the write command 244 are transferred to the memory array 205 for controlling the read and write operation of the memory array 205.

During a read operation, the array address input 240 is transferred to the memory array 205 to access a location containing a selected grouping (row) 210 of the SMT MRAM memory cells 210 and their associated the grouping or row 225 of ECC encoded memory cells. The data 246 from the selected grouping 215 and the associated error correction data 248 are transferred to an ECC decoder which performs an error detection operation. If there is an error in the data 246, the ECC decoder corrects the data and transfers the corrected data 254 to external circuitry and to the scrub machine 255. If there is an error or errors in the data 246, an error flag signal is generated and transferred on the error flag bus 252 to the scrub machine 255. The scrub machine 255 determines if the number of errors occurring at the selected location has exceeded a threshold level established by the scrub threshold value 260. The scrub threshold value 260 is generally the maximum number of errors that are detectable and/or correctable by the ECC decoder 250 and the ECC encoder 235. If the number of errors exceeds the threshold level, the scrub machine 255 transfers the corrected data 254 to the memory data bus 230 to the ECC encoder 235. The ECC encoder 235 re-encodes the corrected data and transfers the encoded corrected data bits 237 and the ECC bits 239 to the selected location within the memory data array 205 and the ECC array 230.

During the time that the corrected data 254 is rewritten to the memory data array 205 and the ECC array 230, the scrub machine 255 transfers a BUSY signal 266 to the external circuitry to inform the external circuitry that the MRAM device is rewriting the encoded corrected data bits 237 and the ECC bits 239 to the memory data array 205 and the ECC array 230. The external circuitry will transfer an new address 256 and new data 258 to the scrub machine 255 with a read/write signal 262. If the scrub machine 255 is in the process of re-writing encoded corrected data bits 237 and the ECC bits 239 to the MRAM data array 205 and the ECC array 220, the scrub machine 255 can halt the rewriting or hold the rewriting until the new data 258 is written to the new selected address 256. At the completion of the writing of the new data 258, the scrub machine 255 resumes the writing of the encoded corrected data bits 237 and the ECC bits 239.

A scrub signal 264 is provided to command the scrub machine 255 to scrub the memory data array 205 and the ECC array 230 to eliminate any potential errors. The scrub signal 264, in some embodiments, will command the scrub machine 255 to scrub the entire memory data array 205 and the ECC array 230. In other embodiments, the scrub signal 264, in conjunction with the address 256, commands the scrub machine 255 to scrub a selected location within the memory data array 205 and the ECC array 230. It is further within the scope of other embodiments that the scrub signal 264 and the address 256 to indicate a range of locations within the memory data array 205 and the ECC array 230 to be scrubbed by the scrub machine 255.

The number of bits in each of the groups of bits of the ECC array 230 determines the extent of coverage of the ECC code. If the ECC code is more robust, the number of errors that are able to be tolerated in the memory data array 205 and the ECC array 230 can be larger. The scrub threshold signal establishes a threshold of the number of errors that are to be tolerated before scrubbing a location within the memory data array 205 and the ECC array 230. Therefore, as described above, when an error flag signal that indicates an error or errors has occurred, the error flag bus 252 provides a count of the number of errors found within the selected location within the memory data array 205 and the ECC array 230. When the count exceeds the scrub threshold value 260, the selected location is scrubbed by the scrub machine 255. The error flag bus is a multiple-bit bus (n) indicating the number of errors that have occurred in a given location based on the number of bits of error detection given the coverage of the ECC code Error threshold is determined each time an associated internal data bus of a particular address is being read.

In some embodiments, the scrub machine 255 scrubs the memory data array 205 and the ECC array 230 to eliminate any potential errors at certain intervals regardless how many errors at a particular address.

Figure 3:
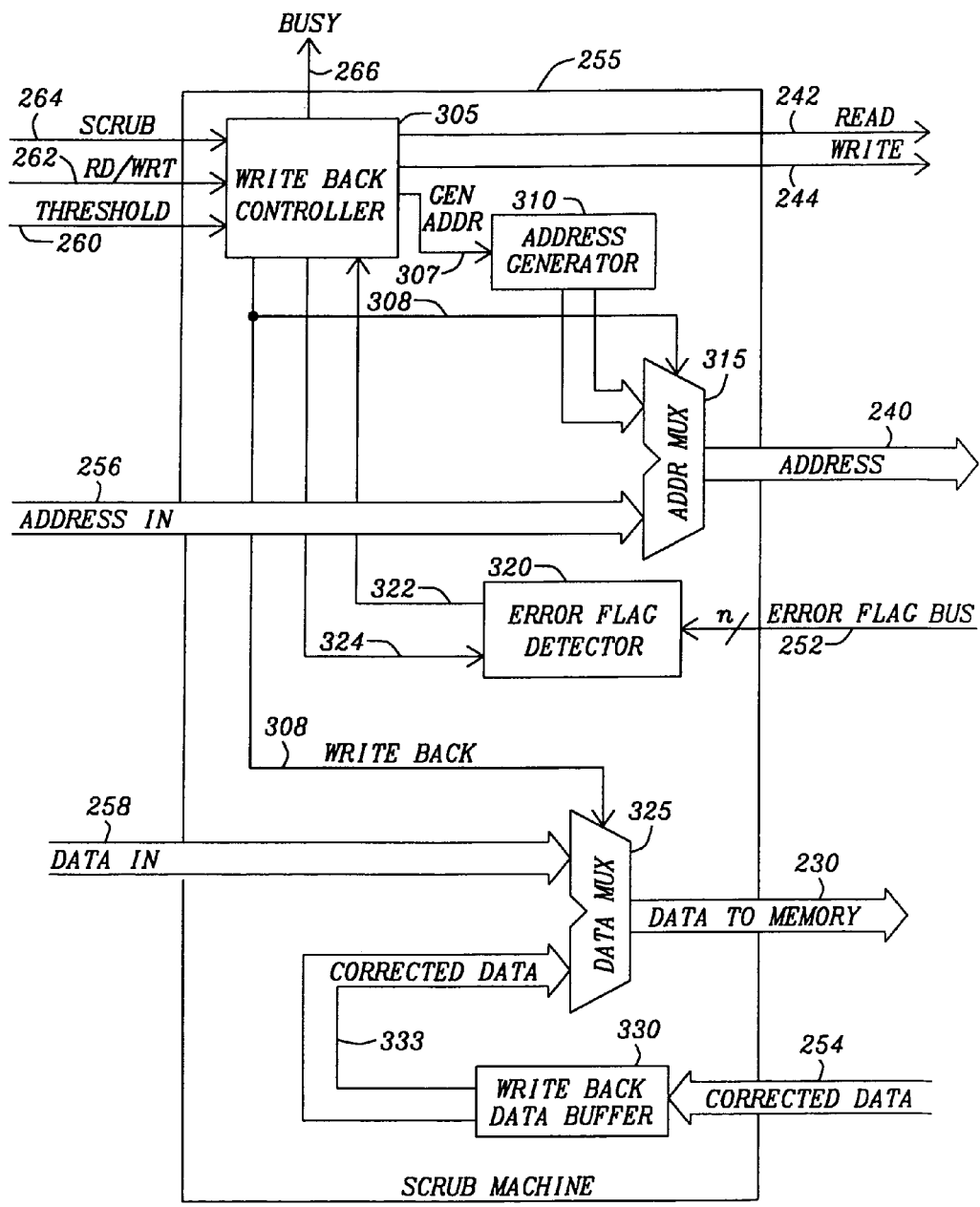
FIG. 3 is a block diagram of the embodiment of the scrubbing machine of FIG. 2.

Refer now to FIG. 3 for a discussion of the data scrubbing apparatus or scrub machine 255 of FIG. 2. The write back controller 305 provides the necessary control and timing signals for controlling the scrub machine 255 in the reading, writing, and writing back of data to the memory data array 205 of FIG. 2. The write back controller 305 receives the scrub threshold value signal 260 and sets the maximum number of errors accumulated before initiating a write process to eliminate the disturb accumulated errors from the memory data array 205 and the ECC array 230.

The read/write signal 262 determines whether memory data array 205 and the ECC array 230 is to be written to or read from. The data input 258 is transferred to a first input of the data multiplexer 325. The corrected data 254 is transferred to a write back data buffer 330. The write back data buffer maintains the corrected data pending write back to the memory data array 205. The output data 333 of the data buffer 330 is the second input to the data multiplexer 325. The write back signal 308 controls whether new data from the data input 258 or corrected data 333 is transferred at the output of the data multiplexer 325 to the memory data bus 230. When the read/write signal 262 indicates that there is a write to the memory data array 205, the data input 258 is transferred to the memory data bus 230. When the read/write signal 262 indicates that there is a data read operation and the data error flag bus 252 indicates there is an error in the read data and the number of errors in the data is greater than the scrub threshold, the write back signal 308 is activated and the corrected data 333 is transferred to the memory data bus 230.

When the read/write signal 262 determines that memory data array 205 and the ECC array 230 is being written to or read from, the write back signal 308 is deactivated and the address multiplexer is set to transfer the address input 256 to the array address input 240. The write back controller 305 activates the read signal 242 or the write signal 244 to inform the memory data array 205 that a read or write operation is occurring.

The error flag detector 320 receives the data error flag bus 252 from the ECC decoder 250 of FIG. 2 and transfers an error count signal 322 to the write back controller 305 indicating the error count received from data error flag bus 252. The write back controller 305 compares the error count signal 322 with the scrub threshold value 260 and if the value of error count signal 322 exceeds the scrub threshold value 260, the write back controller 305 activates the write back signal 308 to transfer the corrected data 333 to the memory data bus 230. Coincidently, the write back controller 305 activates the generate address signal 307 to cause the address generator 310 to regenerate the original address of the data having the error in the memory data array 205. The regenerated address 313 is transferred to the first input of the address multiplexer 315 and the address input 256 is transferred to the second input of the address multiplexer 315. When the write back signal 308 is activated, the address multiplexer 315 transfers the regenerated address 313 to the array address input 240.

Figure 4:
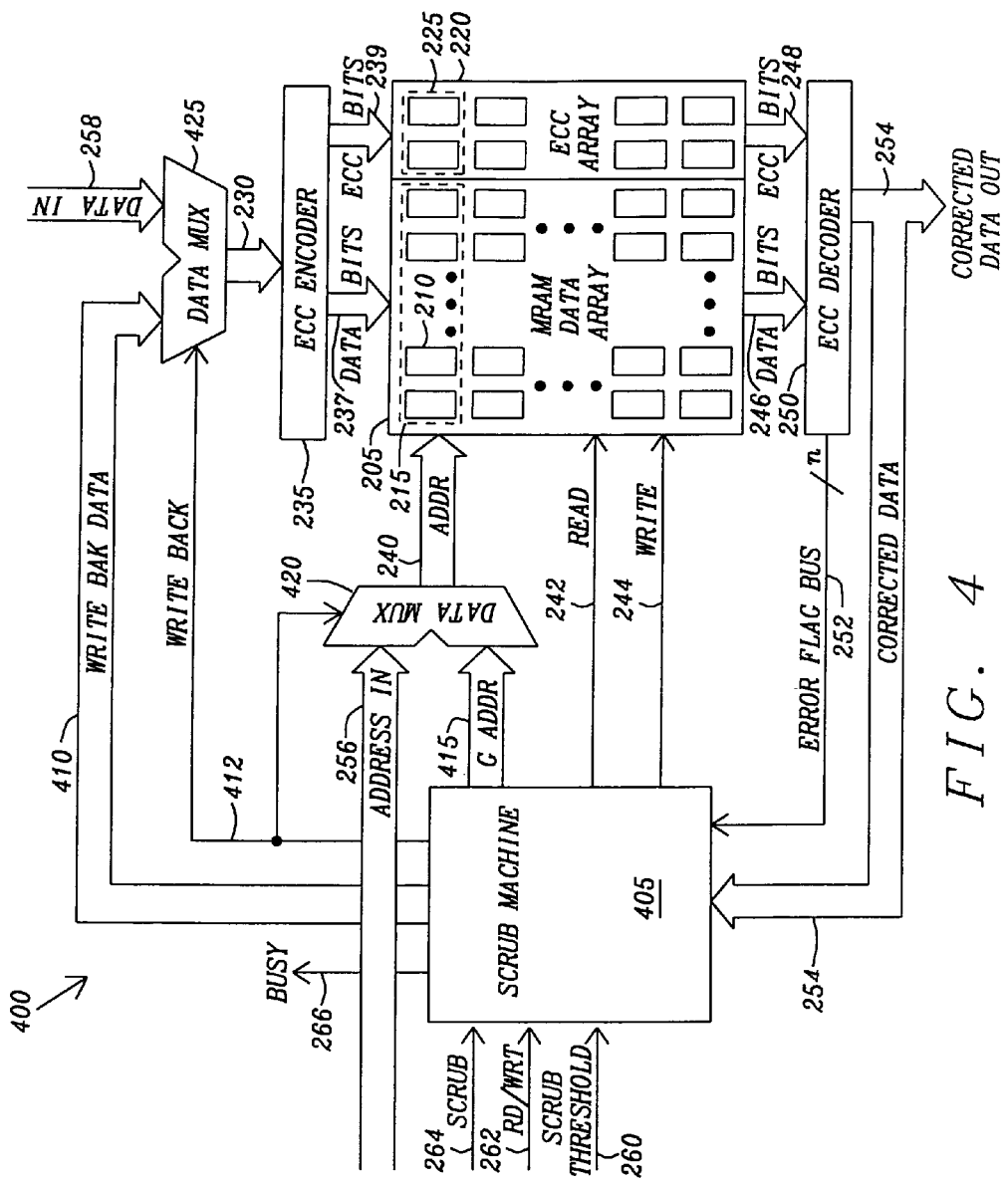
FIG. 4 is a block diagram of another embodiment of an SMT MRAM device including an alternative embodiment of the scrubbing machine.

Refer now to FIG. 4 for a description of a memory device 400 having a data scrubbing apparatus or scrub machine 405 that receives and buffers the corrected data 254. The scrub machine 405 receives the scrub threshold value 260 which is generally the maximum number of errors that are detectable and/or correctable by the ECC decoder 250 and the ECC encoder 235. When the error flag signal indicates that the ECC decoder 250 has detected and corrected an error, the scrub machine records the accumulated count of the errors at the selected location and when the number of accumulated errors has exceeded the scrub threshold value 260, the scrub machine 405 transfers the corrected data to the write back data bus 410.

The scrub machine 405 regenerates the address of the selected location of the data in the memory array 205 and the ECC array 220 having the errors. The address is transferred to the generated address bus 415 which is an input to the address multiplexer 420. The scrub machine 405 activates the write back signal 412 and the corrected data is transferred to the memory data bus 230 and the address of the selected location having the errors is transferred to the address bus 240. The scrub machine 405 activates the write signal 244 and the corrected data is written back to the selected location or the memory array 205 and the ECC array 220 to correct the stored data. During the time that the corrected data 254 is rewritten to the memory data array 205 and the ECC array 230, the scrub machine 405 transfers a BUSY signal 266 to the external circuitry to inform the external circuitry that the MRAM device is rewriting the corrected data bits 237 and the ECC bits 239 to the memory data array 205 and the ECC array 230.

In a read or write operation from external circuitry, the scrub machine 405 receives a read/write signal 262 indicating that the externally provided address 256 and externally provided data 258 are to take precedence and scrub machine 405 deactivates the write back signal. In a read operation, the read signal 242 is activated and only the externally provided address is accepted by the memory array 205 and the ECC array 220. The address 240 points to the selected location and the data and appended ECC code bits are read and transferred to the ECC decoder 250. The ECC decoder 250 determines whether an error has occurred and corrects the error if possible. If the error flag bus 252 indicates that the number of errors is greater than the scrub threshold, the scrub machine 405 performs the appropriate write back function as described above.

In a write operation, the write signal is activated and the externally provided address 256 and externally provided data 258 are transferred to the memory array 205 and the ECC array 220. The externally provided data is transferred through the data multiplexer 425 to the memory data bus 230 to the ECC encoder 235 where the ECC code that is to be appended to the externally provided data is generated. After the ECC code generation, the data bits 237 and the ECC code bits 239 are transferred to the memory array 205 and the ECC array 220.

If the scrub machine 405 is in the process of performing a write back and the external circuitry activates the read/write signal, the scrub machine 405 suspends the write back process until completion of the read or write process from the external circuitry.

The external circuitry can further activate a scrub signal 256 that commands the scrub machine to eliminate errors from the memory array 205 and the ECC array 220 regardless of the level of error in the memory array 205 and the ECC array 220. The scrub signal 256 may indicate a complete scrubbing of errors in the memory array 205 and the ECC array 220 or have an encoded address range that indicate a portion of the memory array 205 and the ECC array 220 to be scrubbed of errors. The scrub machine 405 will then generate an address 415 for the initial location to be scrubbed. The read signal 242 is activated and the data from the location is extracted from the memory array 205 and the ECC array 220. If there is no error in the data, the scrub machine 405 then increments the address 415 for the next location to be scrubbed, and the data is read from the memory array 205 and the ECC array 220. This continues until the error flag bus 252 indicates the number of errors is greater than scrub threshold. When there is an error or errors, the corrected data 254 is received and buffered by the scrub machine 405 to be transferred to the write back data bus 410. The write back signal 412 is activated and the corrected data is written back to the selected location with the error to correct the error.

It should be noted that the data multiplexer 425, the address multiplexer 420, and the scrub machine 405 together perform the function of the scrub machine 255 of FIG. 2. The data multiplexer 425 and the address multiplexer 420 are now associated with the memory array 205 and the ECC array 220 and may actually have more input portals to allow multiple locations for reading data from or for writing data to the memory array 205 and the ECC array 220 as in a multi-ported memory device.

Figure 5:
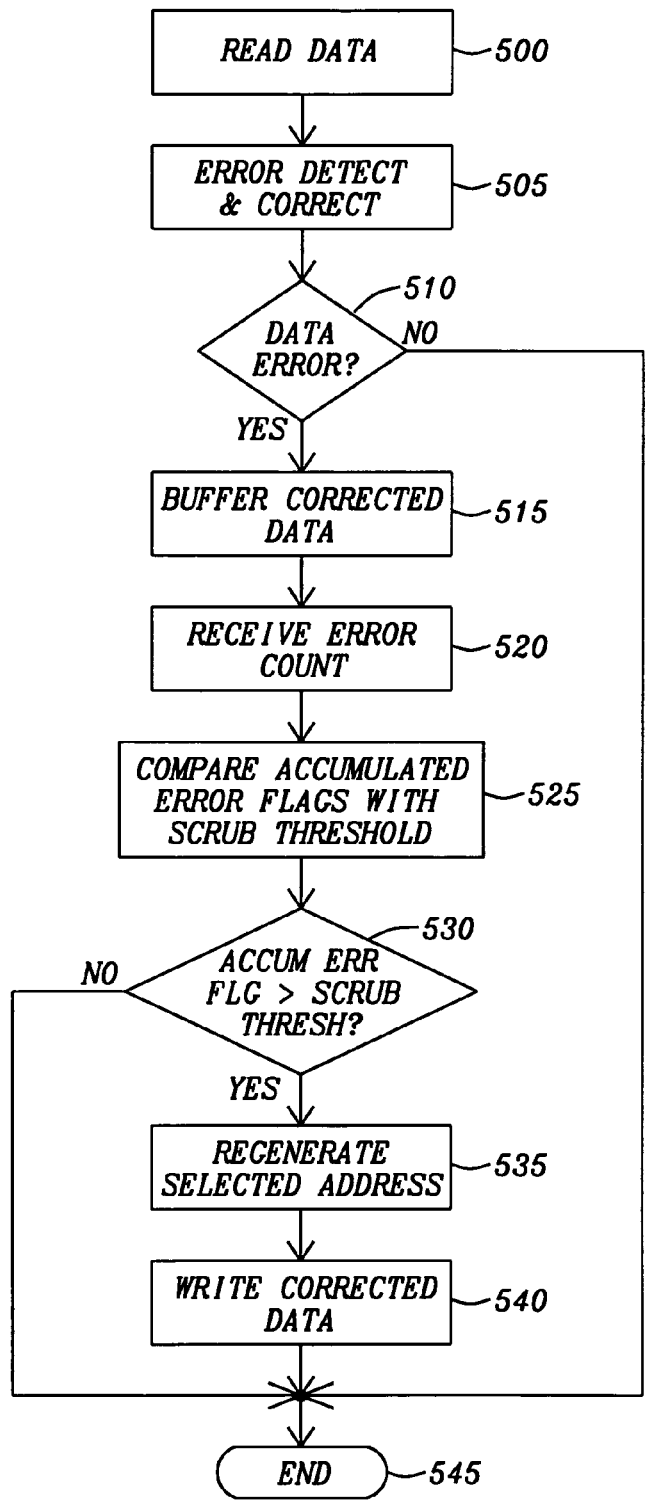
FIG. 5 is a flow diagram illustrating a method for scrubbing disturb errors from an SMT MRAM device.

Refer now to FIG. 5 for a discussion of a method for scrubbing disturb errors from an SMT MRAM device. An SMT MRAM device is read (Box 500) and the data and its appended ECC code are processed to detect and correct (Box 505) any errors within the data and appended ECC code. In the evaluation of the data and appended ECC code, an ECC flag is tested (Box 510) to determine if there has been errors corrected. If there are no errors, the process is ended (Box 545). If there are errors a scrubbing process is initiated, with the corrected data being buffered (Box 515). An error flag accumulator is incremented (Box 520) to maintain the number of errors detected within the data. The number of errors detected within the selected location is compared (Box 525) to a provided scrub threshold value. The comparison of the number of detected errors evaluated (Box 530). If the number of accumulated errors is not greater than the scrub threshold value, the process is ended (Box 545). If the number of errors is greater than the scrub threshold value, the address of the selected location is regenerated (Box 535) and the corrected data written (Box 540) to the selected location of the SMT MRAM device. The process is completed (Box 545) at this point and will be initiated only when a data is read (Box 500) from the SMT MRAM device.

Figure 6:
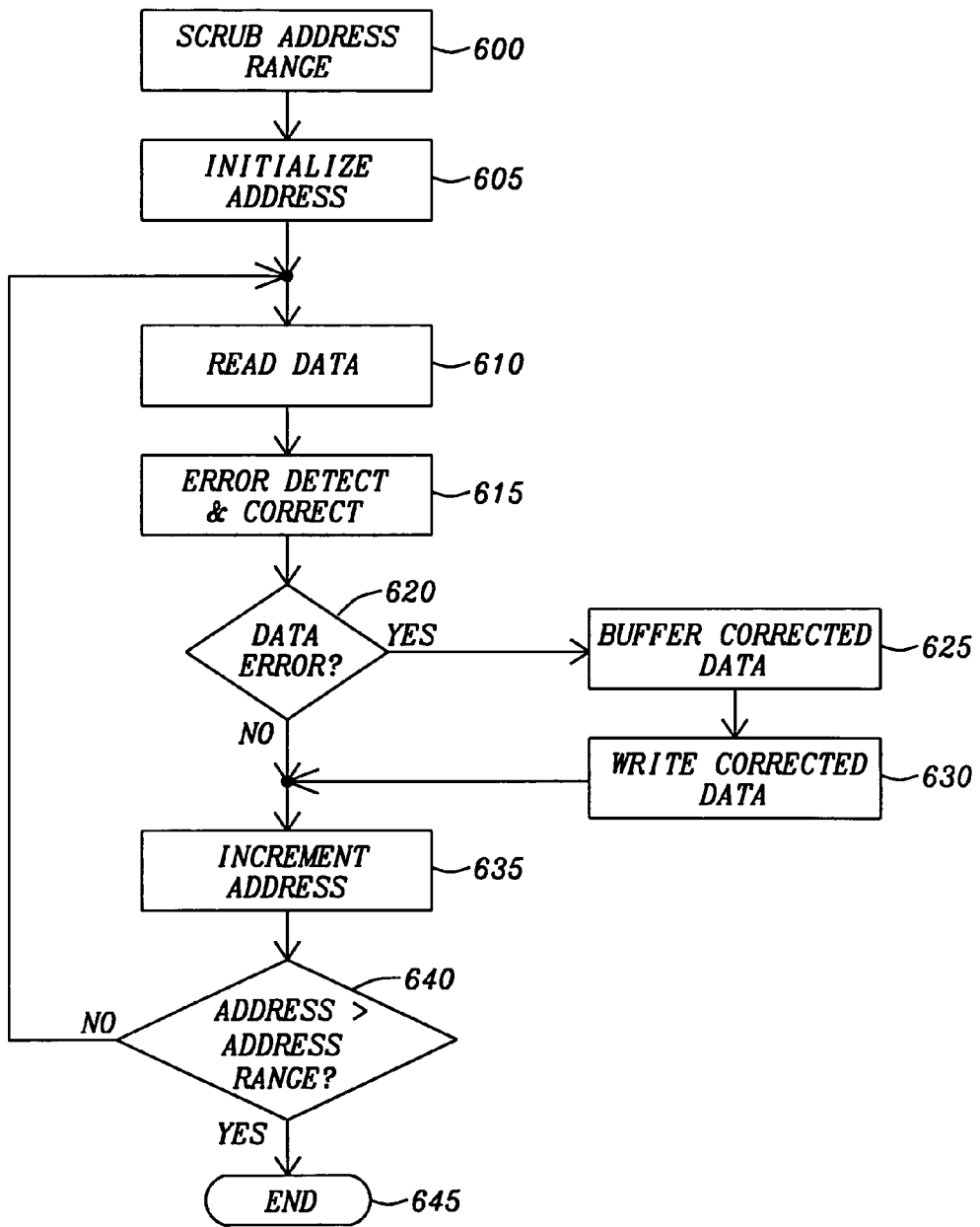
FIG. 6 is a flow diagram illustrating another embodiment of a method for scrubbing disturb errors from an SMT MRAM device where a range of addresses of the SMT MRAM device are scrubbed.

Refer now to FIG. 6 for a discussion of another embodiment of a method for scrubbing disturb errors from an SMT MRAM device. A scrub operation begins by defining (Box 600) an address range within the an SMT MRAM device that is to be scrubbed. An address generator is initiated (Box 605) and the data is read (Box 610) from the selected address.

The data and its appended ECC code are processed to detect and correct (Box 615) any errors within the data and appended ECC code. In the evaluation of the data and appended ECC code, an ECC flag is tested (Box 620) to determine errors were corrected. If there are errors, a scrubbing process is initiated, with the corrected data being buffered (Box 625). The corrected data written (Box 630) to the selected location of the SMT MRAM device.

Upon writing (Box 630) the corrected data or if there are no errors, the address generator is incremented (Box 635). The present address within the address generator is compared (Box 640) to the maximum address of the address range. If the present address is within the address range, the data from the incremented address is read (Box 600) and the scrubbing process is repeated. If the present address is not within the address range, the process is completed (Box 645) at this point and will be initiated only on command from an external control circuitry.

In memory devices such as a dynamic random access memory (DRAM), a refresh operation is performed at regular intervals to overcome any externally caused disturb errors and errors due to discharge of a data retention capacitor in each cell of the DRAM. The process of the embodiments as shown are initiated on as needed or desired basis rather than periodically. The disturb errors in the case of a memory device such as an SMT MRAM are caused as a result of the process for reading is similar to the process for programming the SMT MRAM device cell only at lower current level. Thus a statistical chance of the SMT MRAM device cell being disturbed or rewritten provides for desirability of the randomness of the scrubbing of the disturb errors within the SMT MRAM device according to the embodiments as described.

While this invention has been particularly shown and described with reference to the preferred embodiments thereof, it will be understood by those skilled in the art that various changes in form and details may be made without departing from the spirit and scope of the invention.

The invention claimed is:

1. A data scrubbing apparatus for correcting disturb data errors occurring in an array of SMT MRAM memory cells, the data scrubbing apparatus comprising:
   an error flag bus in communication with error correcting circuitry within the array of memory cells configured for providing an error flag signal indicating a number of detectable and correctable errors occurring in data accessed during one data read operation in a grouping of the SMT MRAM memory cells within the array of SMT MRAM memory cells;
   an error flag detector in communication with error flag bus for receiving the error flag signal and configured for accumulating an error count of detected and corrected errors during one data read operation of the grouping of the SMT MRAM memory cells within the array of SMT MRAM memory cells;
   an address generator configured for regenerating an original address of the data having the error in the grouping of the SMT MRAM memory cells within the SMT MRAM memory array and error correction code bits covering the grouping of SMT MRAM memory cells; and
   a write back control device in communication with the error flag detector to receive the error count and configured for comparing the error count with a received scrub threshold signal that provides a threshold value for the number of errors within the grouping of SMT MRAM memory cells that are to be tolerated before scrubbing the grouping of the array of SMT MRAM memory cells, wherein the scrub threshold value is less than or equal to a maximum number of errors that are detectable and correctable by an error correction/detection circuit and in communication with the address generator to receive the regenerated original address and wherein the write back control device is configured for controlling writing back of data corrected subsequent to the one data read operation to the grouping of the SMT MRAM memory cells.

2. The data scrubbing apparatus of claim 1 further comprising a data multiplexer for receiving provided data to be written to the array of the SMT MRAM memory cells and the corrected data and upon receiving a write back signal from the write back control device, transferring the selected one of the provided data and the corrected data to the array of SMT MRAM memory cells.

3. The data scrubbing apparatus of claim 1 wherein the scrub threshold value indicates that the write back control device issues a write back signal after each receipt of the error flag signal.

4. The data scrubbing apparatus of claim 1 wherein the scrub threshold value indicates that the write back control device issues a write back signal after receipt of the error flag signal, the error flag signal indicative of a number of errors corrected by error correcting circuitry within the array of SMT MRAM memory cells.

5. The data scrubbing apparatus of claim 1 wherein the scrub threshold value indicates that the write back control device issues a write back signal after each read cycle of the array of SMT MRAM memory cells when a specific number of errors occurs in the grouping of the array of SMT MRAM memory cells.

6. The data scrubbing apparatus of claim 1 wherein the write back control device suspends writing back during a writing of data to the array of SMT MRAM memory cells.

7. The data scrubbing apparatus of claim 1 wherein the write back control device provides a busy indicator externally to the array of SMT MRAM memory cells during a write back of corrected data.

8. The data scrubbing apparatus of claim 1 wherein the error is caused by the one data read operation disturb or any phenomenon that causes a shift the magnetic orientation of the SMT MRAM cells.

9. The data scrubbing apparatus of claim 1 wherein the data scrubbing apparatus is activated at an as needed non-periodic basis.

10. The data scrubbing apparatus of claim 1 further comprising an address multiplexer configured for receiving at least one external address identifying locations within the array of SMT MRAM memory cells to be written to or read from and for receiving the regenerated original address, and connected to the write back control device receiving a write back signal and configured for transferring the selected one of the at least one external address and the regenerated original address to the array of SMT MRAM memory cells.

11. A memory device comprising:
a data scrubbing apparatus for correcting disturb data errors occurring in an array of SMT MRAM memory cells within the memory device, the data scrubbing apparatus comprising:
an error flag bus in communication with error correcting circuitry within the array of SMT MRAM memory cells configured for providing an error flag signal indicating a number of detectable and correctable errors occurring in data accessed during one data read operation in a grouping of the SMT MRAM memory cells within the array of SMT MRAM memory cells;
an error flag detector in communication with the error flag bus for receiving the error flag signal configured for accumulating an error count of the detected and corrected errors during the one data read operation of a grouping of the SMT MRAM memory cells within the array of SMT MRAM memory cells;
an address generator configured for regenerating an original address of the data having the error in the grouping of the SMT MRAM memory cells within the memory array and error correction code bits covering the grouping of SMT MRAM memory cells; and
a write back control device in communication with the error flag detector to receive the error count and configured for comparing the error count with a received scrub threshold signal that provides a threshold value for the number of errors within the grouping of SMT MRAM memory cells that are to be tolerated before scrubbing the grouping of the array of SMT MRAM memory cells, wherein the scrub threshold value is less than or equal to the maximum number of errors that are detectable and correctable by an error correction/detection circuit and wherein the write back control device is in communication with the address generator to receive the regenerated original address and wherein the write back control device is configured for controlling writing back of data corrected subsequent to the one data read operation to the grouping of the SMT MRAM memory cells.

12. The memory device of claim 11 wherein the data scrubbing apparatus further comprises a data multiplexer for receiving provided data to be written to the array of the SMT MRAM memory cells and the corrected data and upon receiving a write back signal from the address generator transferring the selected one of the provided data and the corrected data to the array of SMT MRAM memory cells.

13. The memory device of claim 11 wherein the scrub threshold value indicates that the write back control device issues a write back signal after each receipt of the error flag signal.

14. The memory device of claim 11 wherein the scrub threshold value indicates that the write back control device issues a write back signal after receipt of the error flag signal indicative of a number of errors corrected by error correcting circuitry within the array of SMT MRAM memory cells.

15. The memory device of claim 11 wherein the scrub threshold value indicates that the write back control device issues a write back signal after each read cycle of the array of SMT MRAM memory cells when a specific number of errors occurs in the grouping of the array of SMT MRAM memory cells.

16. The memory device of claim 11 wherein the write back control device suspends writing back during a writing of data to the array of SMT MRAM memory cells.

17. The memory device of claim 11 wherein the write back control device provides a busy indicator externally to the array of SMT MRAM memory cells during a write back of corrected data.

18. The memory device of claim 11 wherein the error is caused by the one data read operation disturb or any phenomenon that causes a shift the magnetic orientation of the SMT MRAM cells.

19. The memory device of claim 11 wherein the data scrubbing apparatus is activated at an as needed non-periodic basis.

20. The memory device of claim 11 wherein the data scrubbing apparatus further comprises an address multiplexer configured for receiving at least one external address identifying locations within the array of SMT MRAM memory cells to be written to or read from and for receiving the regenerated original address, and connected to the write back control device receiving a write back signal and configured for transferring the selected one of the at least one external address and the regenerated original address to the array of SMT MRAM memory cells.

21. A method for scrubbing disturb data errors occurring in an array of memory cells comprising the steps of:
receiving an error flag signal indicating a number of detectable and correctable errors occurring during one data read operation in a grouping of the SMT MRAM memory cells within the array of SMT MRAM memory cells;
accumulating an error count of detected and corrected errors detected during the one data read operation of the grouping of the SMT MRAM memory cells within the array of SMT MRAM memory cells;
receiving a scrub threshold signal that provides a threshold value for the number of errors within the grouping of SMT MRAM memory cells that are to be tolerated before scrubbing the grouping of the SMT MRAM array of memory cells, wherein the threshold value is less than or equal to the maximum number of errors that are detectable and correctable by an error correction/detection circuit;
comparing the accumulated error count with the received scrub threshold signal;
regenerating an original address of the data having the error in the grouping of the SMT MRAM memory cells within the SMT MRAM memory array and error correction code bits covering the grouping of SMT MRAM memory cells when the number of errors in the grouping of SMT MRAM memory cells exceeds a scrub threshold value; and
writing corrected data back to the grouping of SMT MRAM memory cells at the location designated by the regenerated original address of the data having the error.

22. The method for scrubbing disturb data errors of claim 21 further comprising multiplexing provided data to be written to the array of the SMT MRAM memory cells and the corrected data for transferring the selected one of the provided data and the corrected data to the array of SMT MRAM memory cells.

23. The method for scrubbing disturb data errors of claim 21 wherein the scrub threshold value indicates that the write back control device issues a write back signal after each receipt of the error flag signal.

24. The method for scrubbing disturb data errors of claim 21 wherein the scrub threshold value indicates that the write back control device issues a write back signal after each read cycle of the array of SMT MRAM memory cells when a specific number of errors occurs in the grouping of the array of SMT MRAM memory cells.

25. The method for scrubbing disturb data errors of claim 21 further comprises suspending writing back during a writing of provided data to the array of SMT MRAM memory cells.

26. The method for scrubbing disturb data errors of claim 21 further comprising providing a busy indicator externally to the array of SMT MRAM memory cells during a write back of corrected data.

27. The method for scrubbing disturb data errors of claim 21 wherein the error is caused by the one data read operation disturb or any phenomenon that causes a shift the magnetic orientation of the SMT MRAM cells.

28. The method for scrubbing disturb data errors of claim 21 further comprising activating the method for data scrubbing data errors at an as needed non-periodic basis.

29. The method for scrubbing disturb data errors of claim 21 further comprising the step of multiplexing at least one external address identifying locations within the array of SMT MRAM memory cells to be written to or read from and the regenerated original address based on a state of a write back signal for transferring the selected one of the at least one external address and the regenerated original address to the array of SMT MRAM memory cells.

30. An apparatus for scrubbing disturb data errors occurring in an array of SMT MRAM memory cells comprising:
means for receiving an error flag signal indicating a number of detectable and correctable errors occurring during one data read operation in a grouping of the SMT MRAM memory cells within the array of SMT MRAM memory cells;
means for accumulating an error count of detected and corrected errors detected during one data read operation of the grouping of the SMT MRAM memory cells within the array of SMT MRAM memory cells;
means for receiving a scrub threshold signal that provides a threshold value for the number of errors within the grouping of SMT MRAM memory cells that are to be tolerated before scrubbing the grouping of the array of SMT MRAM memory cells, wherein the scrub threshold value is less than or equal to the maximum number of errors that are detectable and correctable by an error correction/detection circuit;
means for comparing the accumulated error count with the received scrub threshold signal;
means for regenerating an original address of the data having the error in the grouping of the SMT MRAM memory cells within the memory array and error correction code bits covering the grouping of SMT MRAM memory cells when the number of errors in the grouping of SMT MRAM memory cells exceeds a scrub threshold value; and
means for writing corrected data back to the grouping of memory cells at the location designated by the regenerated original address of the data having the error.

31. The apparatus for scrubbing disturb data errors of claim 30 further comprising means for multiplexing provided data to be written to the array of the SMT MRAM memory cells and the corrected data for transferring the selected one of the provided data and the corrected data to the array of SMT MRAM memory cells.

32. The apparatus for scrubbing disturb data errors of claim 30 wherein the scrub threshold value indicates that the write back control device issues a write back signal after each receipt of the error flag signal.

33. The apparatus for scrubbing disturb data errors of claim 30 wherein the scrub threshold value indicates that the write back control device issues a write back signal after each read cycle of the array of SMT MRAM memory cells when a specific number of errors occurs in the grouping of the array of SMT MRAM memory cells.

34. The apparatus for scrubbing disturb data errors of claim 30 further comprises means for suspending writing back during a writing of provided data to the array of SMT MRAM memory cells.

35. The apparatus for scrubbing disturb data errors of claim 30 further comprising means for providing a busy indicator externally to the array of SMT MRAM memory cells during a write back of corrected data.

36. The apparatus for scrubbing disturb data errors of claim claim 30 wherein the error is caused by the one data read operation disturb or any phenomenon that causes a shift the magnetic orientation of the SMT MRAM cells.

37. The apparatus for scrubbing disturb data errors of claim 30 further comprising a means for activating the apparatus for data scrubbing data errors at an as needed non-periodic basis.

38. The apparatus for scrubbing disturb data errors of claim 30 further comprising means for multiplexing at least one external address identifying locations within the array of SMT MRAM memory cells to be written to or read from and the regenerated original address based on a state of a write back signal for transferring the selected one of the at least one external address and the regenerated original address to the array of SMT MRAM memory cells.

39. An MRAM device comprising:
    a data scrubbing apparatus for correcting disturb data errors occurring in an array of MRAM cells within the MRAM device, the data scrubbing apparatus comprising;
        an error flag bus in communication with error correcting circuitry within the array of memory cells configured for providing an error flag signal indicating a number of detectable and correctable errors occurring in data accessed during one data read operation in a grouping of the MRAM cells within the array of MRAM cells;
        an error flag detector in communication with error flag bus for receiving the error flag signal configured for accumulating an error count of the detected and corrected errors during the one data read operation of the grouping of the MRAM cells within the array of MRAM cells;
        an address generator configured for regenerating an original address of data having detected and corrected errors in the grouping of the MRAM cells within the array of MRAM cells and error correction code bits covering the grouping of MRAM cells; and
        a write back control device in communication with the error flag detector to receive the error count and compare the error count with a received scrub threshold signal that provides a threshold value for the number of errors within the grouping of MRAM cells that are to be tolerated before scrubbing the grouping of the array of MRAM cells, wherein the scrub threshold value is less than or equal to the maximum number of errors that are detectable and correctable by an error correction/detection circuit and wherein the write back control device is in communication with the address generator to receive the regenerated original address and wherein the write back control device is configured for controlling writing back of data corrected subsequent to the one data read operation to the grouping of the MRAM cells.

40. The MRAM device of claim 39 wherein the data scrubbing apparatus further comprises a data multiplexer for receiving provided data to be written to the array of the MRAM cells and the corrected data and upon receiving a write back signal from the address generator transferring a selected one of the provided data and the corrected data to the array of MRAM cells.

41. The MRAM device of claim 39 wherein the scrub threshold value indicates that the write back control device issues a write back signal after each receipt of the error flag signal.

42. The MRAM device of claim 39 wherein the scrub threshold value indicates that the write back control device issues a write back signal after receipt of the error flag signal indicative of a number of errors corrected by error correcting circuitry within the array of MRAM cells.

43. The MRAM device of claim 39 wherein the scrub threshold value indicates that the write back control device issues a write back signal after each read cycle of the array of MRAM cells.

44. The MRAM device of claim 39 wherein the write back control device suspends writing back during a writing of data to the array of MRAM cells.

45. The MRAM device of claim 39 wherein the write back control device provides a busy indicator externally to the array of MRAM cells during a write back of corrected data.

46. The MRAM device of claim 39 wherein the MRAM cells within the array of MRAM cells are SMT MRAM cells.

47. The MRAM device of claim 39 wherein the error is caused by the one data read operation disturb or any phenomenon that causes a shift the magnetic orientation of the MRAM cells.

48. The MRAM device of claim 39 wherein the data scrubbing apparatus is activated at an as needed non-periodic basis.

49. The MRAM device of claim 39 wherein the data scrubbing apparatus further comprises an address multiplexer configured for receiving at least one external address identifying locations within the array of MRAM cells to be written to or read from and for receiving the regenerated original address, and connected to the write back control device receiving a write back signal and configured for transferring the selected one of the at least one external address and the regenerated original address to the array of MRAM cells.

* * * * *